United States Patent

Frederiksen

[15] 3,670,219

[45] June 13, 1972

[54] CURRENT LIMITING TRANSISTOR

[72] Inventor: Thomas M. Frederiksen, Scottsdale, Ariz.

[73] Assignee: Motorola, Inc., Franklin Park, Ill.

[22] Filed: Dec. 7, 1970

[21] Appl. No.: 95,760

[52] U.S. Cl. ......................317/235 R, 317/235 Z, 317/235 D
[51] Int. Cl. ..........................................................H01l 19/00
[58] Field of Search..................................................317/235

[56] References Cited

UNITED STATES PATENTS 3,358,197 12/1967 Searlett.................................317/235

OTHER PUBLICATIONS

IBM Tech. Discl. Bul. " Transistor Underpass" by Flaker et al., Vol. 13, No. 5, Oct. 1970 pg. 1382.

*Primary Examiner*—Jerry D. Craig
*Attorney*—Mueller & Aichele

[57] ABSTRACT

A transistor which may be fabricated on a chip is disclosed whose beta remains at about a constant value with collector current up to a desired percentage above the maximum rated load value thereof and then falls off very rapidly, whereby the collector current never exceeds a desired value. This is accomplished by providing a resistor using the emitter diffusion, within the base region of the transistor and then passing all of the emitter current through this resistor. At a designable value of current flow, transistor action is locally, enhanced at the remote end of this emitter resistor and the current gain of the transistor is thereby degraded as high level injection conditions are artifically established in this localized region.

4 Claims, 3 Drawing Figures

PATENTED JUN 13 1972

3,670,219

INVENTOR.
*Thomas M. Frederiksen*
BY
*Mueller & Aichele*
ATTY'S

CURRENT LIMITING TRANSISTOR

BACKGROUND

Transistor circuits are known in which the beta of the transistor remains substantially constant from zero collector current to a value somewhat above maximum rated collector current and then the collector current of the transistor is reduced very rapidly, to prevent overloading and therefore destroying or injuring the transistor. This is usually done by connecting circuit elements to the transistor. One known way of so doing is to add circuit elements which divert the base current from the transistor when its collector current reaches the desired maximum. It would be advantageous to provide a transistor which can be fabricated on a chip and which is so constructed that its collector current is self-limiting.

It is an object of this invention to provide a transistor which limits the collector current therethrough at or near its maximum rated collector current value.

It is another object of this invention to provide a transistor which limits collector current and yet which presents a nearly constant beta from zero collector current up to the maximum rated value of collector current.

SUMMARY

In accordance with this invention, the transistor is constructed in a manner to provide a long emitter as well as normal emitters, and the total emitter current is taken through this long emitter. In this manner, the long emitter, due to the travel of current carriers therealong, acts as an emitter resistor, which however has very little effect on the beta at low collector current and greatly reduces the beta of the transistor at above rated values of the collector current. The loss of current gain of the transistor is a result of the transistor going into high level injection locally at the remote, or output, end of this emitter resistor. The transistor can be built, if desired, in a high powered form by providing additional parallelly connected emitters of normal construction and also providing several base connections located between the several emitters, the several emitters being connected in parallel and the several base connections may also be connected in parallel. The total emitter current, however, will be passed through one emitter resistor which will provide the desired limiting action.

DESCRIPTION

The invention will be better understood upon reading the following description in connection with the accompanying drawing in which.

Figure 1:
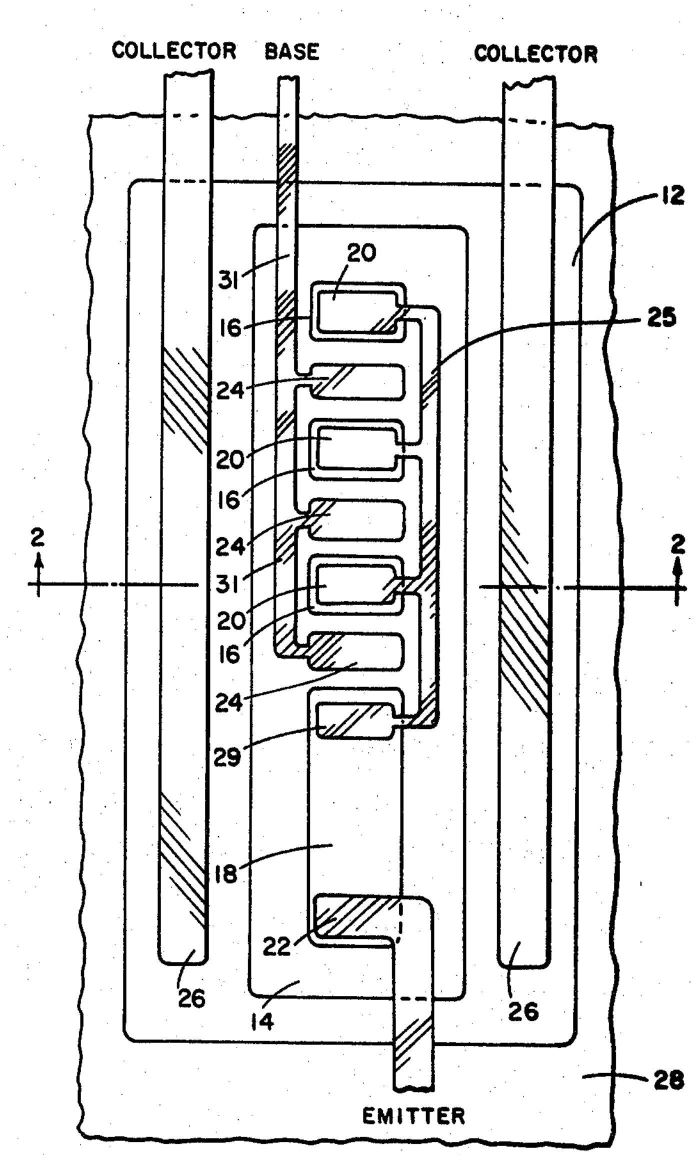
FIG. 1 is a plan view of a transistor embodying the invention.
Figure 2:
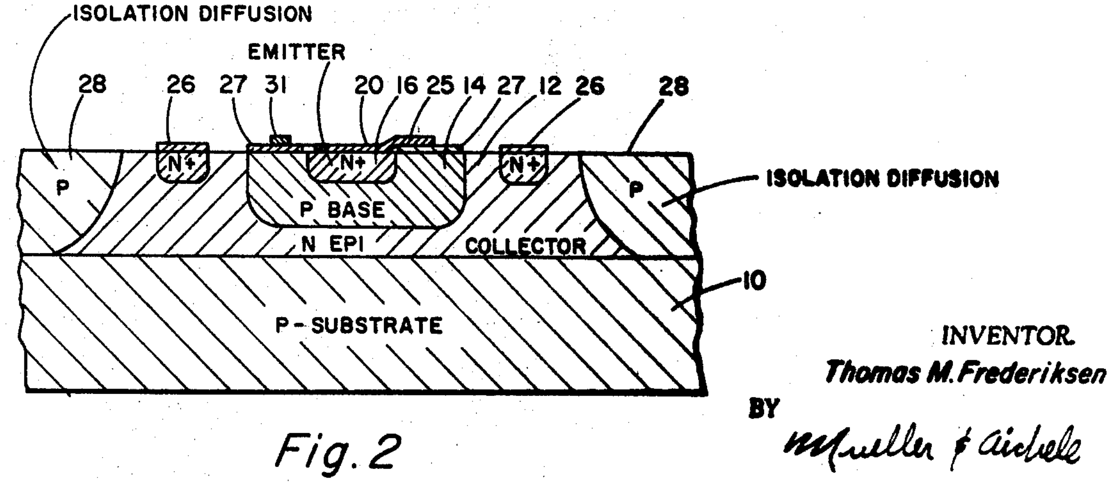
FIG. 2 is a sectional view of the showing of FIG. 1 taken on line 2—2 thereof.

Turning first to FIGS. 1 and 2, a P-substrate 10 is provided on which an N-layer 12 is provided in the known manner as by epitaxy. P-material may be diffused or otherwise provided in the N-layer 12 to provide a long base region 14. Several discrete emitters 16 may be provided along the base region 14 and a long emitter 18 may also be provided in the base region 14, the several emitters 16 and 18 being shown to be in line and their width being shown to be about the same. These emitters 16 and 18 are of N+ material diffused or otherwise provided in the P-base region 14. Emitter contacts 20 are more or less centrally positioned on the emitters 16 nearly covering them and a contact 29 is positioned on the input side of the emitter 18 and a second contact 22 is located at the output end thereof which is remote from the nearest emitter 16. Base connections 24 are provided between successive emitters 16 and 18. Collector contacts 26 which may be connected to each other are provided along the collector 12 on each side of the base 14. Also, as shown, a P-channel diffusion 28 is provided around the collector 12.

In operation and to provide high current, emitters 16 and 18 of the transistor of FIGS. 1 and 2 may be connected together as by leads 25, and the base contacts 24 may be connected together as by leads 31, however, if lower current is desired, only one of the several emitters 16 need be used and only one base contact 24 need be used. In this case, the transistor may be made with only one normal emitter 16 and its contact 20, the long emitter 18 and its contacts 22 and 29, a base long enough to contain the long emitter 18 and a normal emitter 16 and to provide room for a base contact, and a collector big enough to contain the so constructed base and provide room for a collector contact. Insulation 27 is provided for the connectors 25 and 31 in a known manner.

Figure 3:
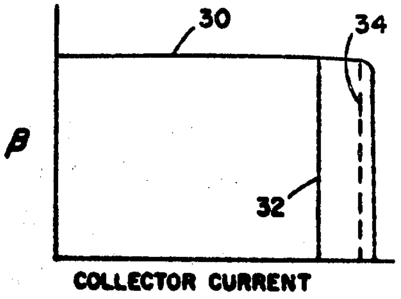
FIG. 3 is a graph which is useful in explaining the invention.

The operation of the disclosed transistor is thought to be as follows: In operation thereof a resistance is developed along the long emitter 18, and current carriers flow along the length thereof in getting to the contact 22. At low emitter current, up to the rated value thereof, much of the emitter current is supplied by the normal emitter 16 and the voltage drop along the emitter 18 is very low. However, as the emitter current goes up, more voltage drop exists along the emitter 18 from contact 29 to the emitter output contact electrode 22. This increasing voltage drop is such that the beta of the transistor drops suddenly for this higher current flow. This is shown in FIG. 3 in which the beta of the transistor as indicated by the line 30 is nearly constant in value from zero collector current to a point beyond rated collector current indicated by the line 32. Then at some value of collector current such as at the dotted line 34, the beta 30 suddenly reduces very quickly to zero. At zero beta, the collector current can no longer increase even though the base or drive current be increased. The length of the level or uniform portion of the beta line 30 can be adjusted by varying the total resistance of region 18 and by providing additional emitters such as 16 and additional base contacts such as 24 if necessary to handle a larger total current. Therefore, a transistor whose collector current is self-limiting and in which the point of current limiting may be predetermined is provided.

While an NPN transistor has been disclosed, a PNP-transistor having the same properties may be provided in the same manner if the NPN-materials are used in place of the PNP-materials respectively.

What is claimed is:

1. A current limiting transistor, comprising:

a. a collector region of a first conductivity type;

b. a base region of a second conductivity type, disposed within the collector region;

c. at least one emitter region, of the first conductivity type, disposed within the base region and having a contact; and d. an elongated emitter region of the first conductivity type disposed within the base region forming an active junction therewith, in combination with the collector comprising a distributive transistor, having a contact at one end thereof electrically connected to the emitter region contact, and having means for external connection at the other end, providing a resistive current path for causing a high level injection at the other end when the current reaches a prescribed level.

2. The transistor of claim 1 further comprising at least one additional emitter region of the first conductivity type, disposed within the base region, and having a contact electrically connected to the emitter region contact and to the elongated emitter region contact.

3. The transistor of claim 1 wherein the elongated emitter region contact is positioned adjacent the emitter region.

4. The transistor of claim 2 wherein the elongated emitter region contact is positioned adjacent the emitter region.

* * * * *